(12) United States Patent
Roesner (10) Patent No.: US 7,684,209 B2
(45) Date of Patent: Mar. 23, 2010

(54) PRINTED CIRCUIT BOARD ENGAGEMENT ASSEMBLY

(75) Inventor: Arlen L. Roesner, Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 105 days.

(21) Appl. No.: 11/880,528

(22) Filed: Jul. 23, 2007

(65) Prior Publication Data

US 2009/0027843 A1    Jan. 29, 2009

(51) Int. Cl.
*H05K 7/12* (2006.01)
(52) U.S. Cl. ............. 361/798; 361/747; 361/754; 361/759; 439/372
(58) Field of Classification Search ............... 361/754, 361/798, 801, 759, 747, 732; 439/372; 312/223.2, 312/223.3
See application file for complete search history.

(56) References Cited

U.S. PATENT DOCUMENTS

| 5,691,859 | A  | * | 11/1997 | Ulrich et al. ............... 360/92.1 |
| 6,252,514 | B1 | * | 6/2001  | Nolan et al. ............. 340/686.4 |
| 6,396,704 | B1 | * | 5/2002  | White ........................ 361/754 |
| 6,406,312 | B1 | * | 6/2002  | Heitkamp ................... 439/160 |
| 6,424,111 | B1 | * | 7/2002  | Romig ................... 318/568.21 |
| 6,975,519 | B2 | * | 12/2005 | Siahpolo et al. ............ 361/798 |
| 7,027,309 | B2 | * | 4/2006  | Franz et al. ................ 361/798 |
| 7,301,778 | B1 | * | 11/2007 | Fang ......................... 361/759 |
| 7,364,447 | B1 | * | 4/2008  | Desrosiers et al. .......... 439/157 |
| 7,463,494 | B2 | * | 12/2008 | Downing et al. ............ 361/798 |
| 2005/0174743 | A1 | * | 8/2005 | Downing et al. ............ 361/725 |

\* cited by examiner

*Primary Examiner*—Dameon E Levi (57) ABSTRACT

In one embodiment a computer system comprises a housing, a backplane coupled to the housing, and at least one floor plate comprising an engagement assembly to connect a printed circuit board assembly to the backplane, wherein the engagement assembly utilizes a single mechanical force lever to secure the printed circuit board assembly to the backplane.

9 Claims, 15 Drawing Sheets

PRINTED CIRCUIT BOARD ENGAGEMENT ASSEMBLY

BACKGROUND

Some electronic devices such as computer systems typically include one or more printed circuit boards. Large computer systems such as, for example, servers and the like may comprise transverse loading printed circuit board assemblies, which are coupled to a communication bus such as, for example, a backplane. Systems and methods to accurately position transverse loading printed circuit board assemblies may therefore find utility.

DETAILED DESCRIPTION

Described herein are embodiments of a computer system comprising a housing, a backplane coupled to the housing, and at least one floor plate in the computer system housing. In some embodiments, the floor plate comprises an engagement assembly operative to connect a printed circuit board assembly to the backplane using a single mechanical force lever. In some embodiments, the single mechanical force lever is rotatable between a first position and a second position and drives two pins from a first position to a second position. The two pins are adapted to couple with corresponding apertures in a circuit board assembly in order to move the circuit board assembly from a first position displaced from the backplane to a second position adjacent to backplane, such that one or more mechanical or electrical interconnects on the circuit board is coupled with one or more corresponding mechanical or electrical interconnects on the backplane.

Reference will now be made in detail to embodiments which are illustrated in the accompanying drawings. While various embodiments are depicted in the accompanying drawings, it will be understood that they are not intended to limit the claims to these embodiments. On the contrary, the appended claims are intended to cover alternatives, modifications and equivalents, which may be included within the spirit and scope of the claims. Furthermore, in the following detailed description, numerous specific details are set forth in order to provide a thorough understanding of the subject matter. In other instances, well known methods, procedures, components, and circuits have not been described in detail as not to unnecessarily obscure aspects of the subject matter.

Figure 1:
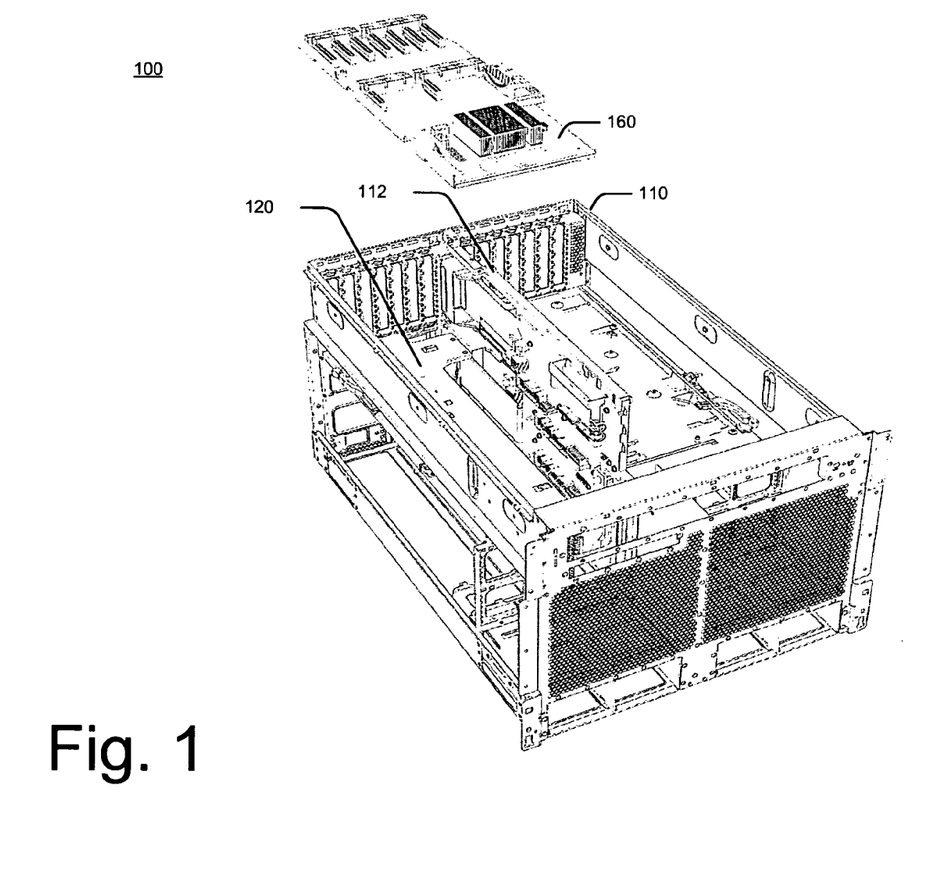
FIG. 1 is a schematic illustration of a computer system, according to embodiments.

FIG. 1 is a schematic illustration of a computer system, according to embodiments. Referring to FIG. 1, a computer system 100 comprises a housing 110, a backplane 112 coupled to the housing, and at least one floor plate 120. The specific design of the housing is not critical to the subject matter described herein. Typically, the housing 110 comprises a frame assembly, air vents, input-output slots, and one or more panels to enclose the housing. Similarly, the specific design of the backplane 112 is not critical to the subject matter described herein. Typically, a backplane such as backplane 112 comprises one or more communication buses and one or more connectors to provide mechanical and/or electrical connections to the backplane 112.

Figure 2:
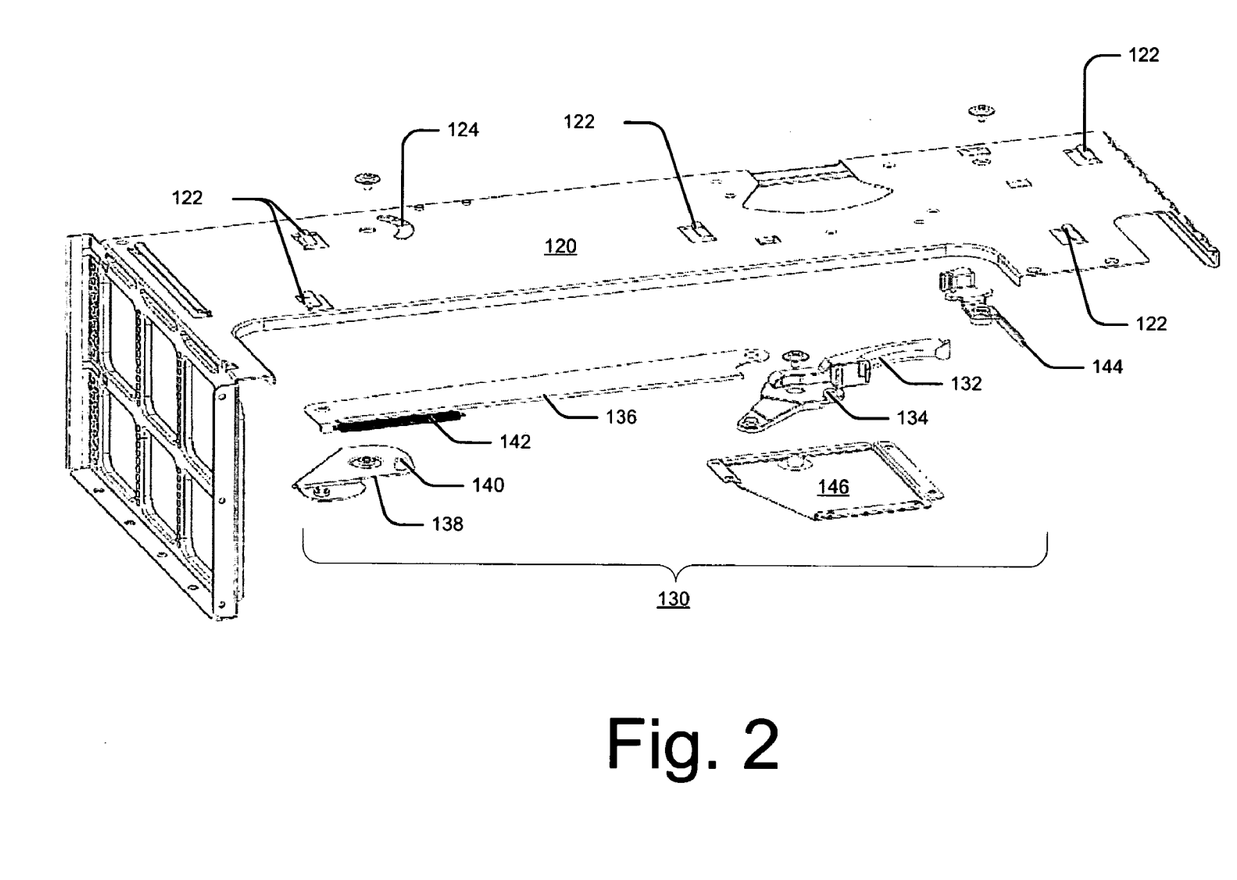
FIGS. 2-6 are schematic, perspective illustrations of a floor plate for a computer system, according to embodiments.

FIGS. 2-6 are schematic, perspective illustrations of a floor plate 120 for a computer system, according to embodiments. Referring first to FIG. 2, in some embodiments, floor plate 120 may be embodied as a mid-floor plate, and may include one or more hooks 122 that extend from the surface of floor plate 120. In the embodiment depicted in FIGS. 2-6, the floor plate 120 comprises five hooks 122.

In some embodiments, an engagement assembly 130 is connected to the floor plate 120. FIG. 2 presents an exploded view of an engagement assembly 130. In some embodiments, engagement assembly 130 comprises a mechanical force lever 132, a linkage arm 136, and a pin plate 138. Engagement assembly 130 may further comprise a spring 142 to bias the engagement assembly, a cover plate 146, and an ejector button 144. In some embodiments, pin plate 138 comprises a pin 140 extending from the surface thereof. Further, in some embodiments, mechanical force lever 132 comprises a pin 134 extending from a surface thereof.

Figure 3:
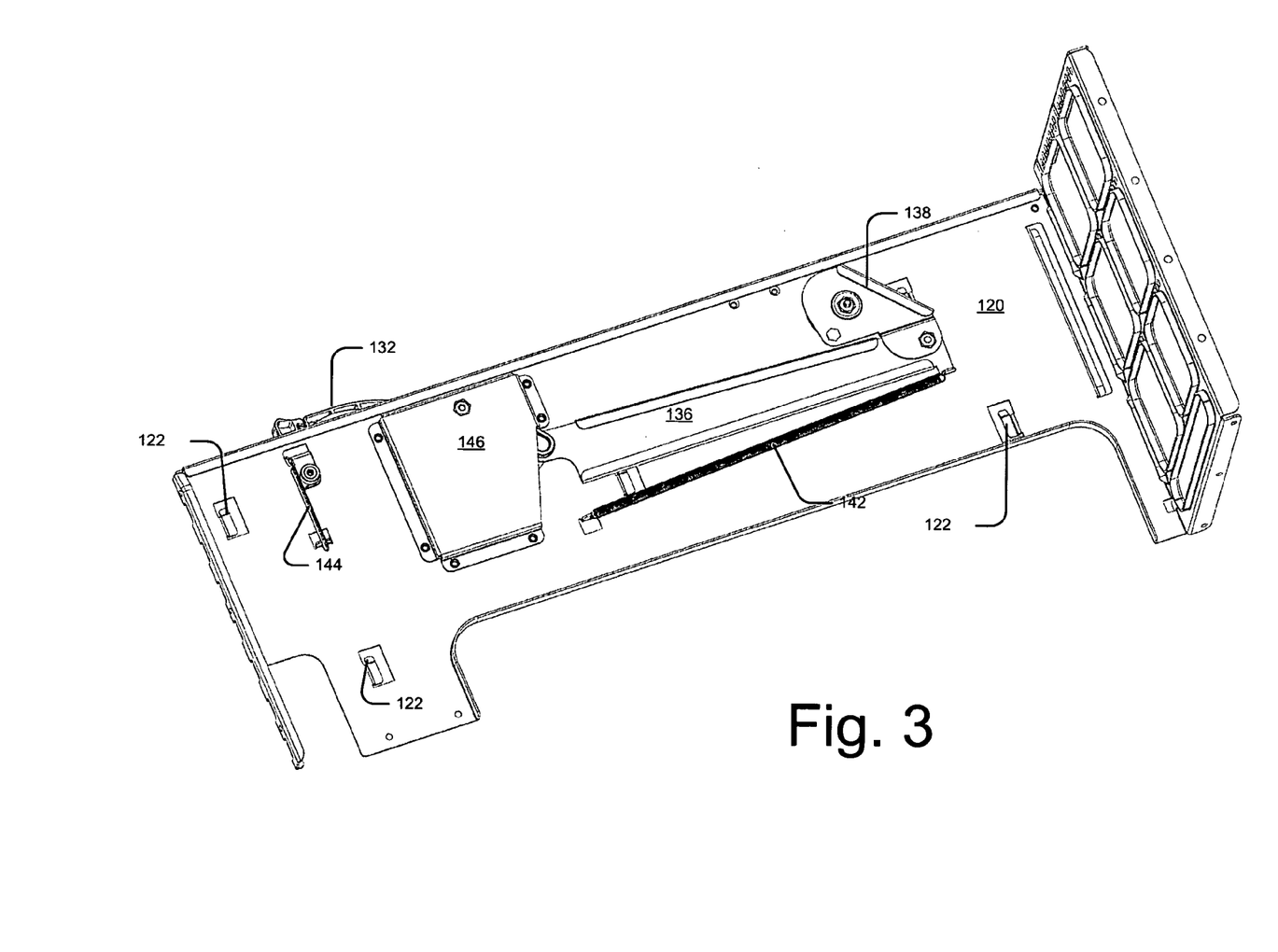
Figure 4:
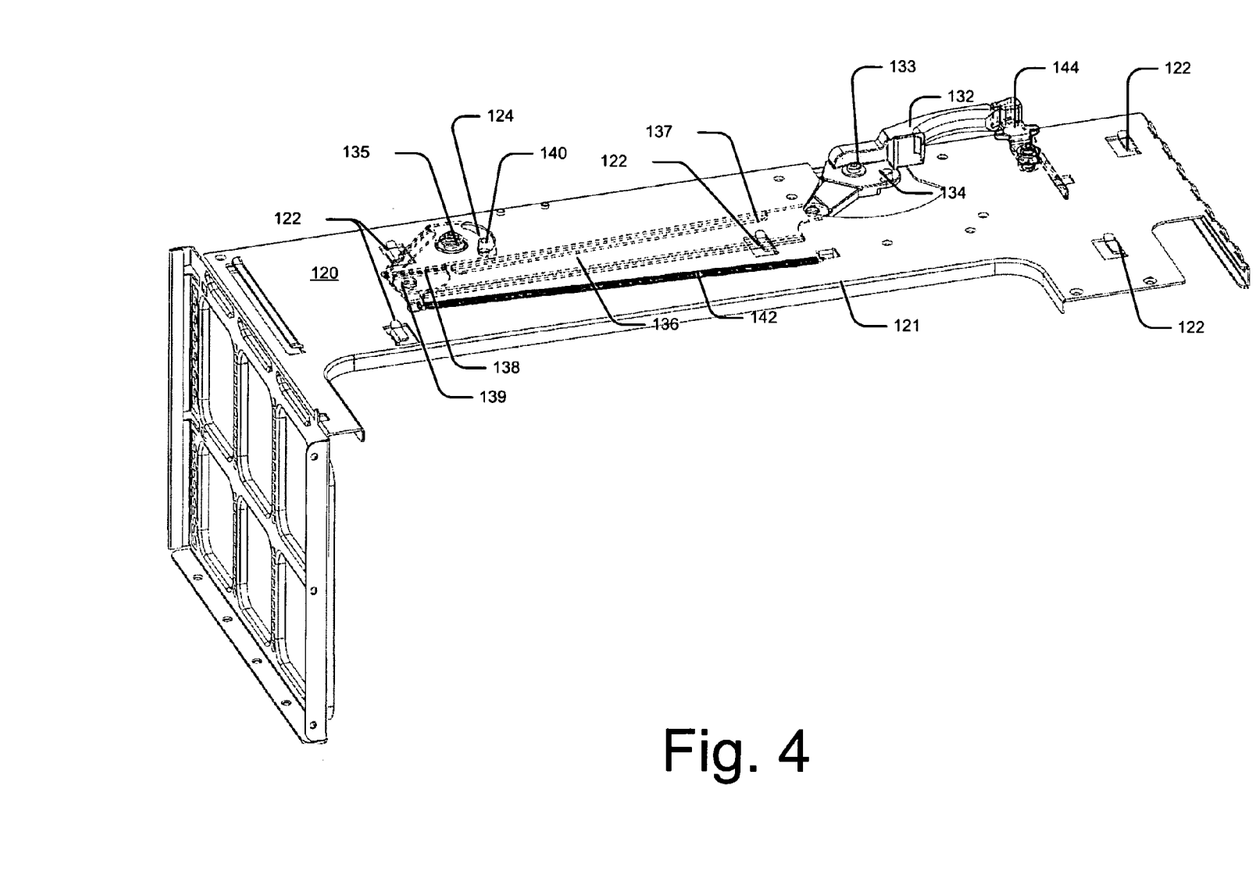

FIG. 3 presents a bottom, perspective view of the floor plate 120 with the engagement assembly 130 assembled and connected to the floor plate 120. FIG. 4 presents a top, perspective view of the floor plate 120 with the engagement assembly 130 assembled and connected to the floor plate 120. In the embodiment depicted in FIGS. 3 and 4, the mechanical force lever 132 is in a "closed" position, such that the mechanical force lever is engaged with ejector button 144.

Referring to FIGS. 3 and 4, the mechanical force lever 132 is connected to the linkage arm 136 by connector 137. Linkage arm 136 is, in turn, connected to pin plate 138 by connector 139. Similarly, mechanical force lever 132 and cover plate 146 are rotatably connected to the floor plate 120 by connector 133 and pin plate 138 is connected to the floor plate 120 by connector 135. In some embodiments, connectors 133, 135, 137, 139 may be implemented as pins, rivets, bolts, screws, or other suitable connectors. Further, ejector button 144 is connected to floor plate 120 by suitable connector.

Referring to FIG. 4, when the engagement assembly 130 is mounted to the floor plate 120, the pin 140 of pin plate 138 extends through a slot 124 in the floor plate 120. Similarly, the pin 134 on mechanical force lever 132 extends above the surface of floor plate 120. When the mechanical force lever 132 is in the closed position as depicted in FIG. 4, the pin 140 is in a first position in slot 124. Similarly, the pin 134 is located in a first position at a first distance from an edge when 121 of floor plate 120.

Figure 5:
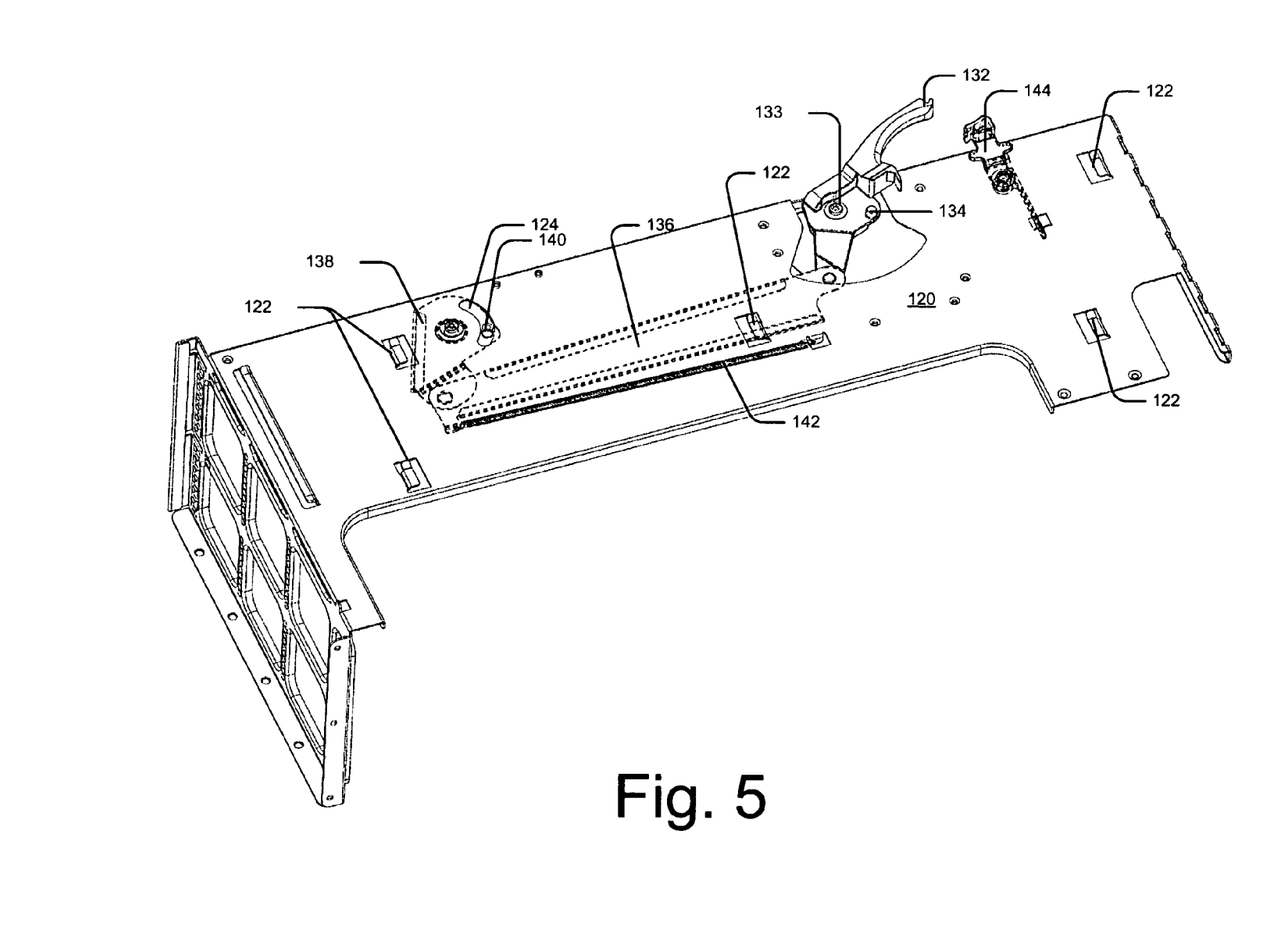

FIG. 5 is a schematic, perspective view of floor plate 120 with the mechanical force lever 132 in a partially open position. Referring to FIG. 5, the mechanical force lever 132 may be disengage from ejector button 144 manually, e.g., by depressing the ejector button 144 to release mechanical force lever 132. Mechanical force lever 132 may be manually rotated about connector 133 to drive linkage arm 136, which in turn rotates pin plate 138 about connector 135. Thus, rotating mechanical force lever 132 drives pin 140 in the slot 124. Further, rotating mechanical force lever 132 moves can 134 about the axis of rotation of mechanical force arm 132.

Figure 6:
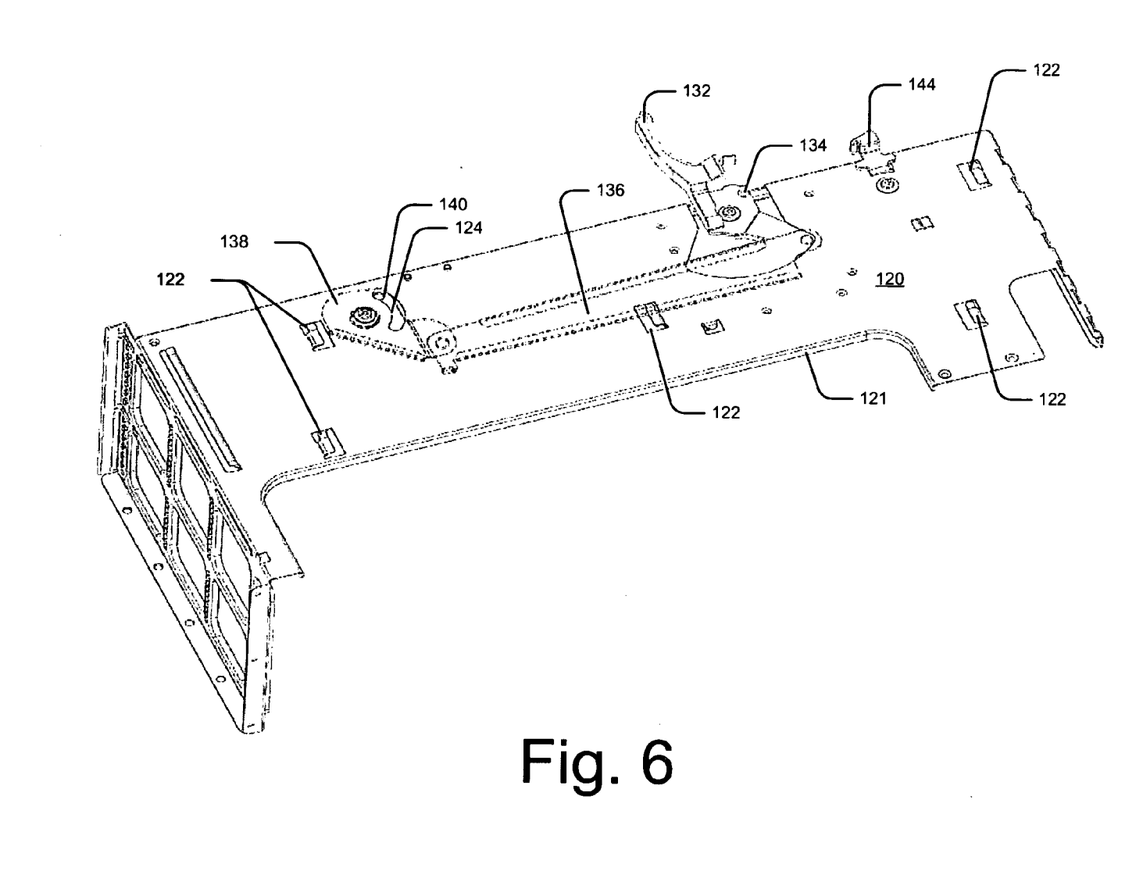

FIG. 6 is a schematic, perspective view of floor plate 120 with the mechanical force lever 132 in a fully open position. Referring to FIG. 6, continued rotation of mechanical force lever 132 about connector 133 drives pin 142 a second position in slot 124, and rotates pin 134 to a second position at a second distance from an edge when 121 of floor plate 120.

Thus, in operation, the engagement assembly 130 may be actuated by rotating mechanical force lever 132 about to connector 133 in order to drives pin 140 between a first position and a second position in slot 124, and to rotate pin 134 between a first position and a second position relative to an edge 121 of the floor plate 120. In one embodiment, the engagement assembly 130 is designed such that the pins 134, 140 move in tandem, i.e., the pins 134, 140 moves the same amount of distance relative to the edge 121 of floor plate 120.

Figure 7:
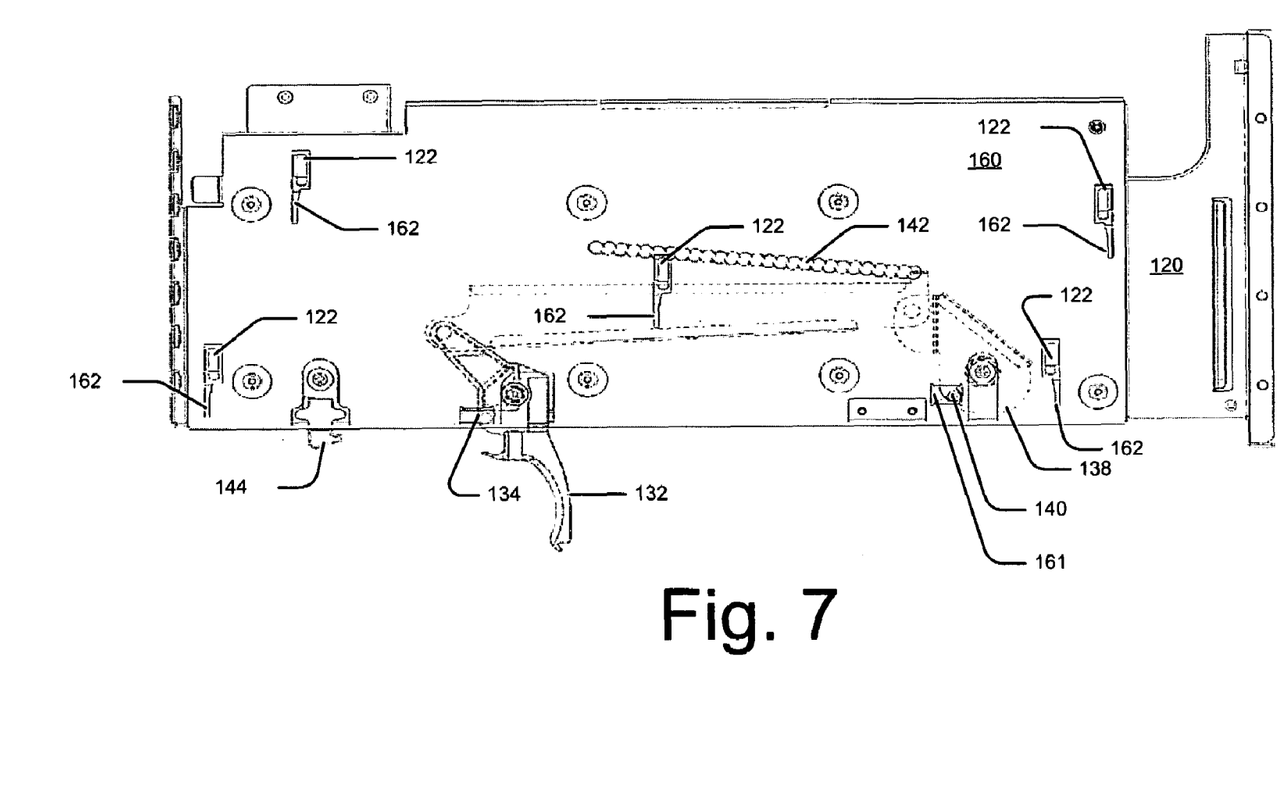
FIGS. 7-10 are schematic, perspective illustration of a floor plate for a computer system having a printed circuit board mounted thereon, according to embodiments.
Figure 8:
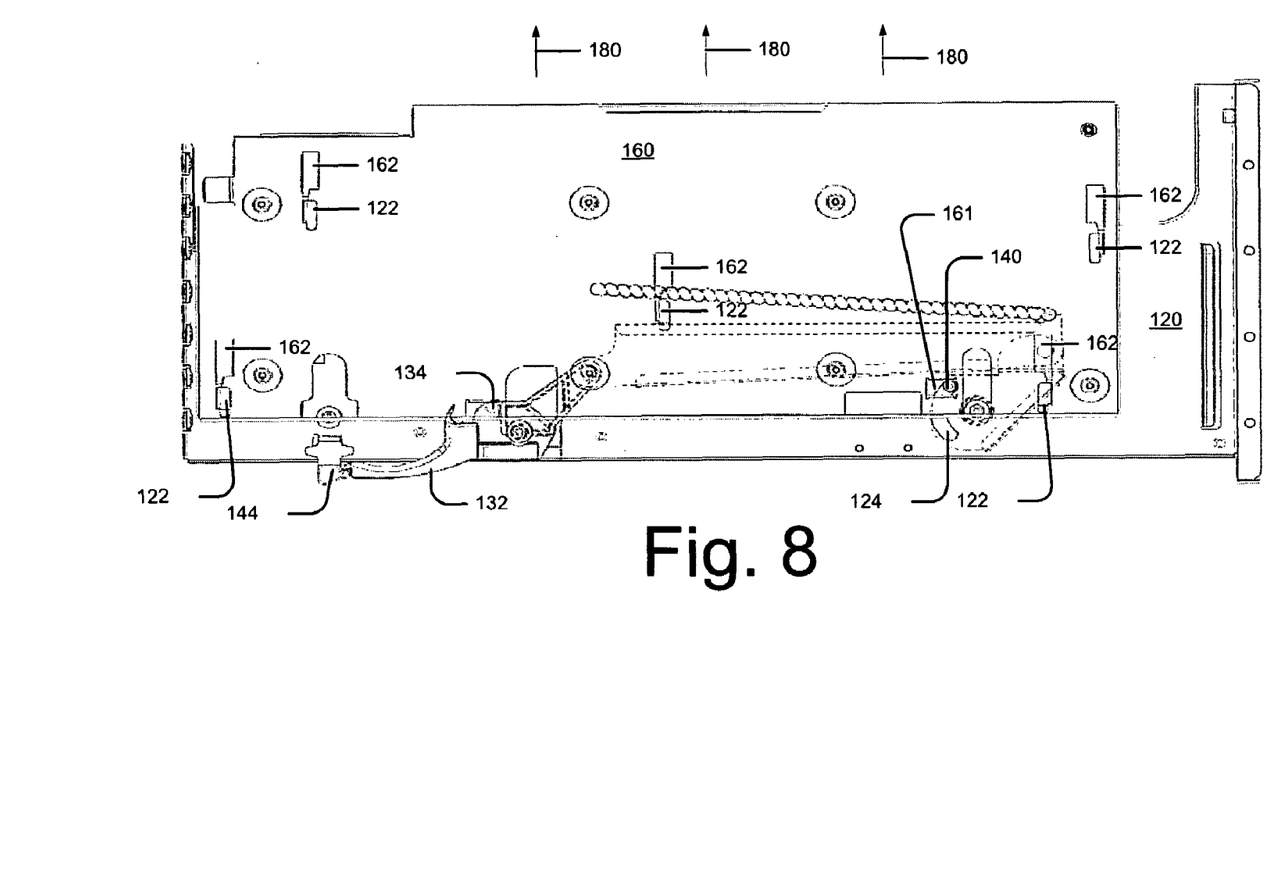

FIGS. 7-10 are schematic, perspective illustration of a floor plate for a computer system having a printed circuit board mounted thereon, according to embodiments. FIGS. 7-8 illustrate aspects of mounting a printed circuit board onto a floor plate 120. FIG. 7 illustrates the floor member 120 when the engagement assembly 130 is in the open position. FIG. 8 illustrates the floor member 120 when the engagement assembly 130 is in the closed position.

Referring to FIG. 7, a printed circuit board assembly 160 may be mounted on the floor plate 120 with the mechanical force lever 132 in the open position. In one embodiment, the printed circuit board assembly 160 may comprise a plurality of slots 162 adapted to mate with the plurality of hooks 122 in the floor plate 120. Further, the printed circuit board assembly 160 comprises at least one aperture 161 to receive pin 140 of pin plate 138, and may include a second aperture 163 to receive pin 134. In the embodiment depicted in FIG. 7, the bias spring 142 is connected to the linkage arm 136 to bias the engagement assembly in the open position.

Referring to FIG. 8, when the mechanical force lever 132 is rotated from the open position depicted in FIG. 7 to the closed position depicted in FIG. 8, the pin 140 is moved within slot 124 and pin 134 rotates about the axis of rotation defined by connector 133, thereby driving circuit board assembly 160 in the direction indicated by arrows 180. Further, when the mechanical force lever 132 is rotated from the closed position in FIG. 8 to the open position depicted in FIG. 7, the pin 140 is moved within slot 124 and pin 134 rotates about the axis of rotation defined by connector 133, thereby driving circuit board assembly 160 in a direction opposite the direction indicated by arrows 180.

Figure 9:
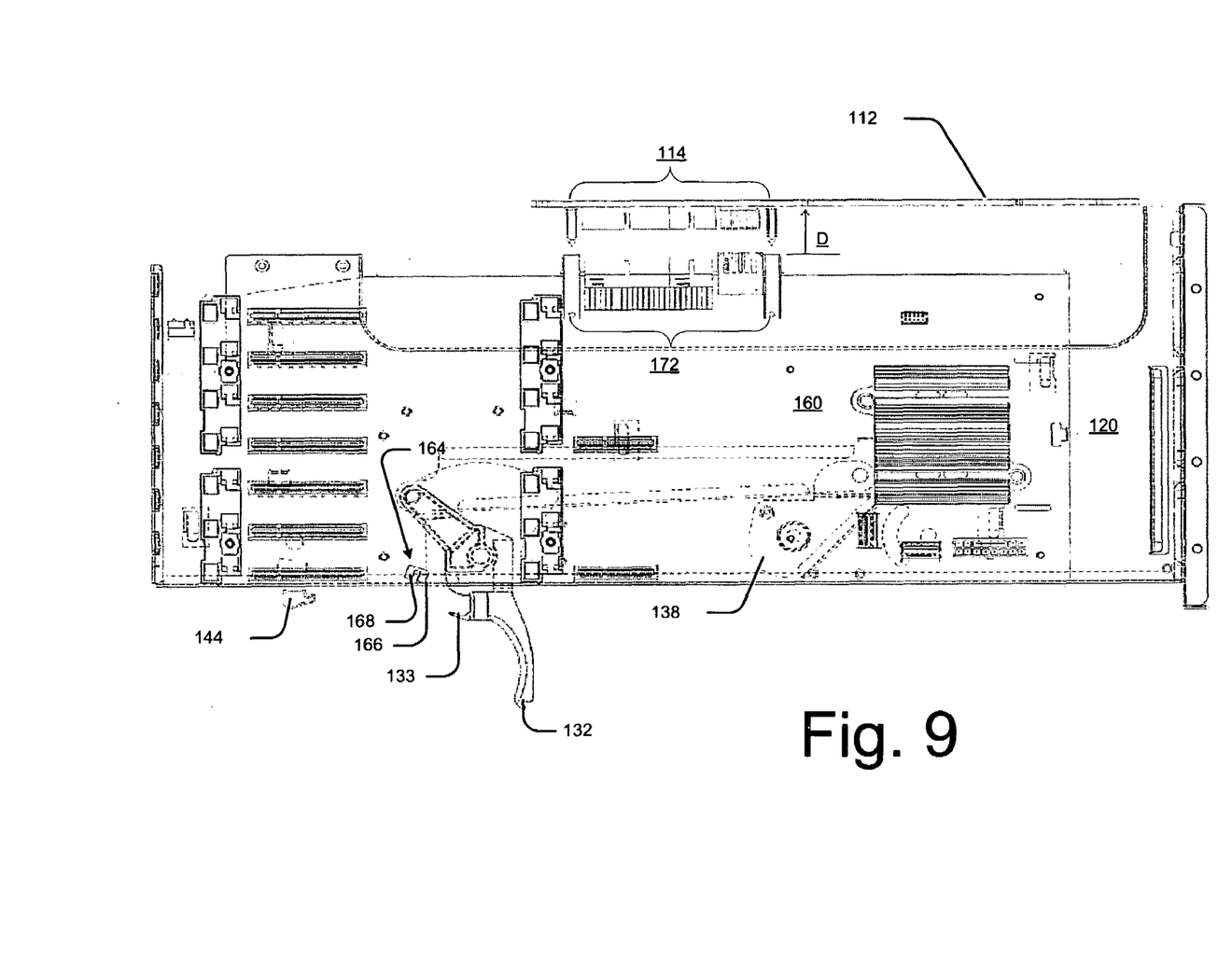
Figure 10:
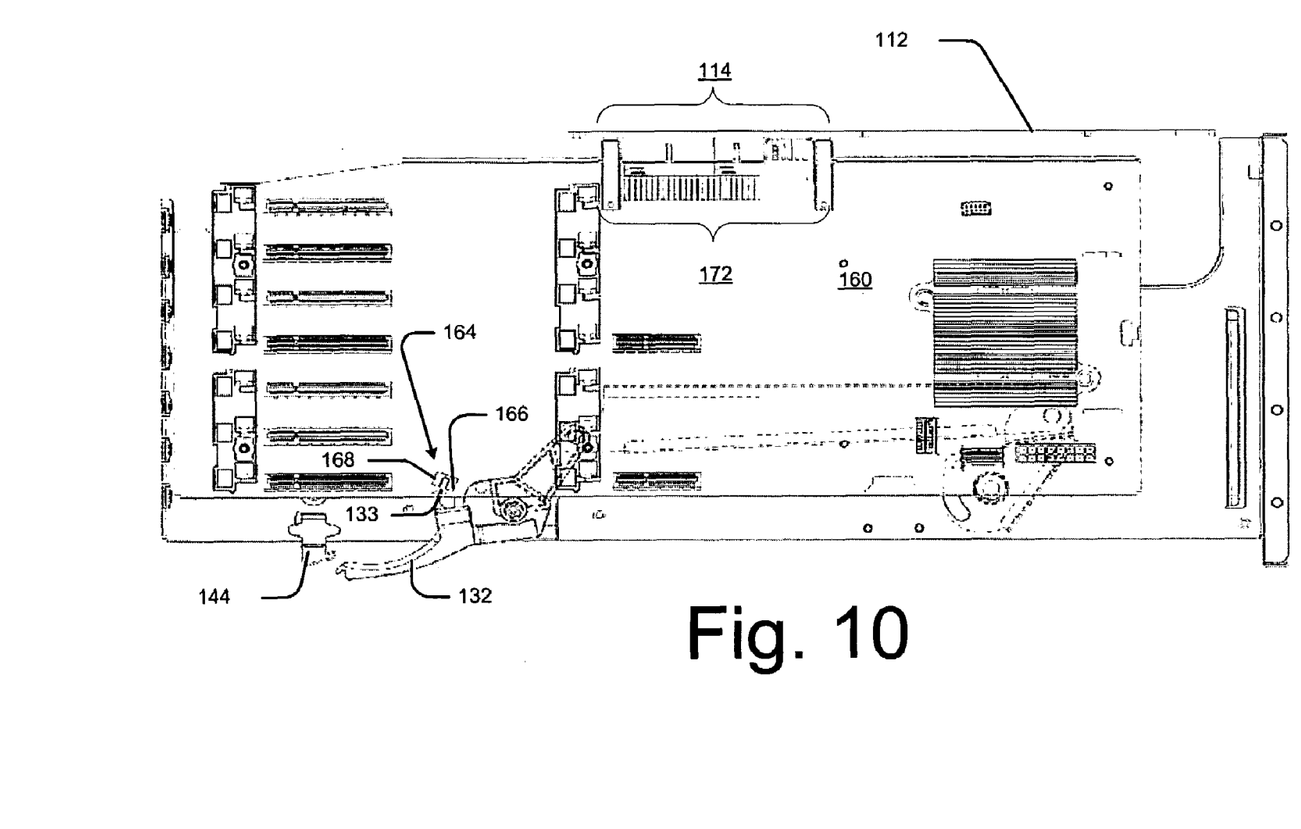

FIGS. 9-10 illustrate additional aspects of mounting a printed circuit board onto a floor plate 120 and connecting the printed circuit board to a backplane. FIG. 9 depicts the circuit board assembly 160 mounted to the floor plate 120 when the engagement assembly 130 is in the open position. The printed circuit board assembly 160 comprises a plurality of interconnects 172 which are adapted to mate with corresponding interconnects 114 on backplane 112. When the engagement assembly 130 is in the open position a distance indicated by the reference distance D in FIG. 9 is provided between the circuit board assembly 160 than a backplane 112. Referring to FIG. 10, when the mechanical force lever is rotated from the open position to the closed position, the circuit board assembly 160 is driven in the direction of the backplane 112, thereby connecting the interconnects 172 on a printed circuit board 160 with the interconnects 114 on the backplane 112. Conversely, when the mechanical force lever is rotated from the closed position to the open position, the circuit board assembly 160 is driven in the direction away from the backplane 112, thereby disconnecting the interconnects 172 on a printed circuit board 160 from the interconnects 114 on the backplane 112.

Thus, the engagement assembly 130 provides a mechanism to engage a printed circuit board assembly 160 the backplane 112, and to disengage the printed circuit board assembly 160 from the backplane using only a single mechanical force lever. Further, because the engagement assembly 130 is configured to move pins 134, 140 in tandem, the pins 134, 140 apply approximately equal force to the circuit board assembly 160, which helps to align the interconnects 172 on a printed circuit board 160 with the interconnects 114 on the backplane 112. In addition, because the displacement applied to the circuit board assembly at the two pins is approximately equal, the printed circuit board remains substantially parallel to the backplane during engagement of the mechanism. This ensures that the connector systems engage linearly without rotation during insertion/ejection.

In some embodiments, the printed circuit board assembly may be configured with a sensor 164 to generate a signal when the mechanical force lever is removed from the closed position, and logic to cut power from the circuit board in response to the signal. For example, the sensor 164 may comprise an optical transmitter 166 such as, e.g., a diode and a receiver 168 such as, e.g., a photodetector. The mechanical force lever 132 may comprise a tooth 133 to disrupt the sensor, e.g., by blocking the receiver when the mechanical force lever 132 is closed. When the mechanical force lever 132 is opened, the receiver 168 would detect radiation from the transmitter and generate a signal. In response to the signal, the circuit board may cut power supplied to the circuit board.

Figure 11:
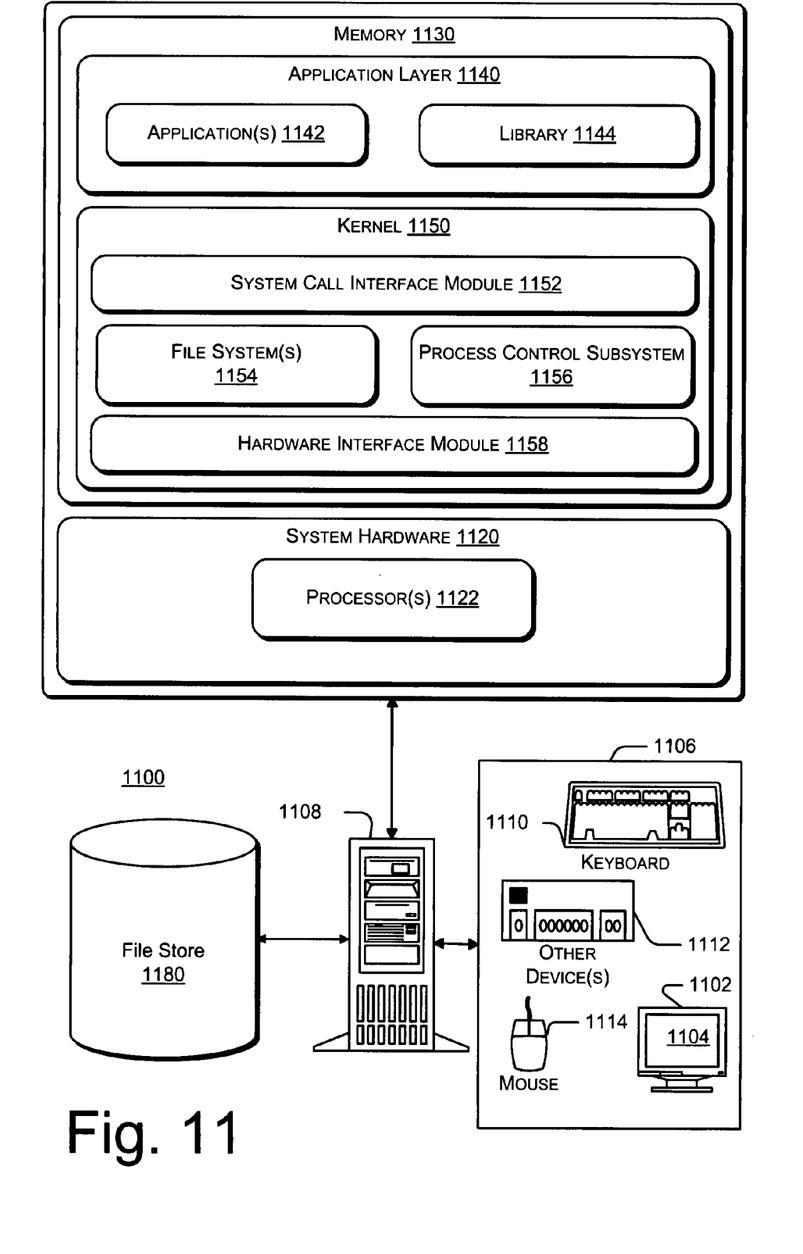
FIG. 11 is a schematic illustration of an exemplary computer system 1100 in which an efficient profiling collector may be implemented.

FIG. 11 is a schematic illustration of an exemplary computer system 1100 in which an efficient profiling collector may be implemented. The computer system 1100 includes a computer 1108 and one or more accompanying input/output devices 1106 including a display 1102 having a screen 1104, a keyboard 1110, other I/O device(s) 1112, and a mouse 1114. The other device(s) 1112 can include a touch screen, a voice-activated input device, a track ball, and any other device that allows the system 1100 to receive input from a developer and/or a user. The computer 1108 includes system hardware 1120 including a processor 1122 and random access memory and/or read-only memory 1130. A file store 1180 is communicatively connected to computer 1108. File store 1180 may be internal such as, e.g., one or more hard drives, or external such as, e.g., one or more external hard drives, network attached storage, or a separate storage network.

Memory 1130 includes an operating system for managing operations of computer 1108. In some embodiments, the operating system may include an application layer 1140, which manages the execution of one or more applications 1142, which in turn may utilize the services of one or more libraries 1144. The operating system may further include a kernel layer 1150, which provides services to applications 1142 executing on the application layer 1140. In one embodiment, kernel 1150 includes a hardware interface module 1158 that provides an interface to system hardware 1120. In addition, kernel 1150 includes one or more file systems 1154 that manage files used in the operation of computer 1108 and a process control subsystem 1156 that manages processes executing on computer 1108. Kernel 1150 further includes a system call interface module 1152 that provides an interface between the operating system 1140 and one or more application modules 1142 and/or libraries 1144.

In operation, one or more application modules 1142 and/or libraries 1144 executing on computer 1108 make calls to the system call interface module 1152 to execute one or more commands on the computer's processor. The system call interface module 1152 invokes the services of the file system(s) 1154 to manage the files required by the command(s) and the process control subsystem 1156 to manage the process required by the command(s). The file system(s) 1154 and the process control subsystem 1156, in turn, invoke the services of the hardware interface module 1158 to interface with the system hardware 1120.

The particular embodiment of operating system is not critical to the subject matter described herein. The operating system may be embodied as a UNIX operating system or any derivative thereof (e.g., Linux, Solaris, etc.) or as a Windows® brand operating system.

Some methods described herein may be embodied as logic instructions on a computer-readable medium. When executed on a processor, the logic instructions cause a general purpose computer device to be programmed as a special-purpose machine that implements the described methods. The processor, when configured by the logic instructions to execute the methods recited herein, constitutes structure for performing the described methods.

FIGS. 12-15 are schematic, perspective illustrations of a floor plate for a computer system, according to embodiments. The embodiments depicted in FIGS. 12-15 are similar to the embodiments depicted in FIGS. 2-6. The primary difference is that the embodiments depicted in FIGS. 2-6 utilize a four-bar linkage mechanism, while the embodiments depicted in FIGS. 12-15 utilize a two-bar linkage mechanism. In the interest of brevity and clarity, the description of common aspects of the assemblies will not be repeated in detail.

Figure 12:
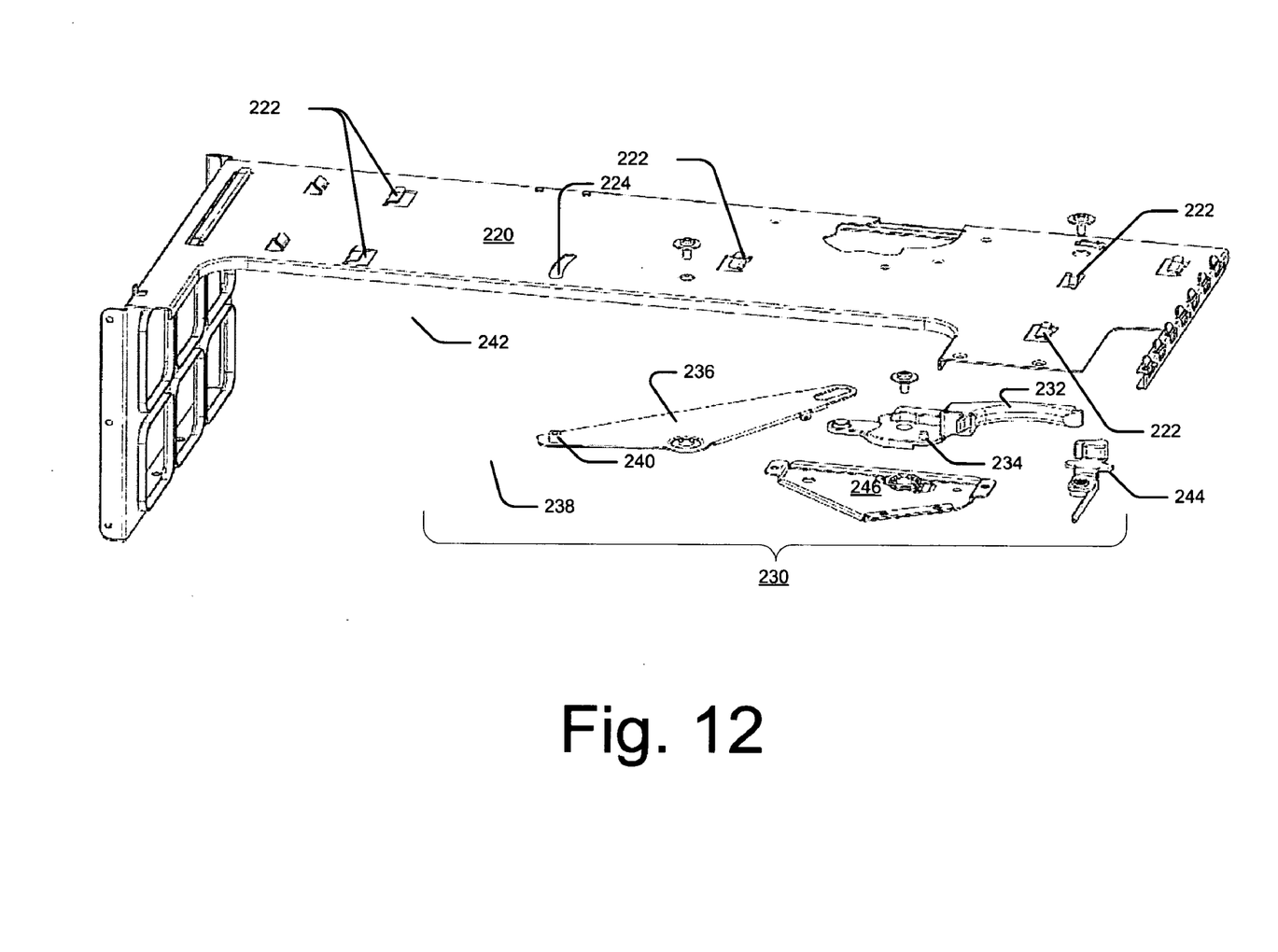
FIGS. 12-15 are schematic, perspective illustrations of a floor plate for a computer system, according to embodiments.

Referring first to FIG. 12, in some embodiments, floor plate 220 may be embodied as a mid-floor plate, and may include one or more hooks 222 that extend from the surface of floor plate 220. In the embodiment depicted in FIGS. 12-16, the floor plate 220 comprises five hooks 222.

In some embodiments, an engagement assembly 230 is connected to the floor plate 220. FIG. 12 presents an exploded view of an engagement assembly 230. In some embodiments, engagement assembly 230 comprises a mechanical force lever 232 and a linkage arm 236 comprising a pin 240 extending from the surface thereof. Engagement assembly 230 may further comprise a cover plate 246, and an ejector button 244. Further, in some embodiments, mechanical force lever 232 comprises a pin 234 extending from a surface thereof.

Figure 13:
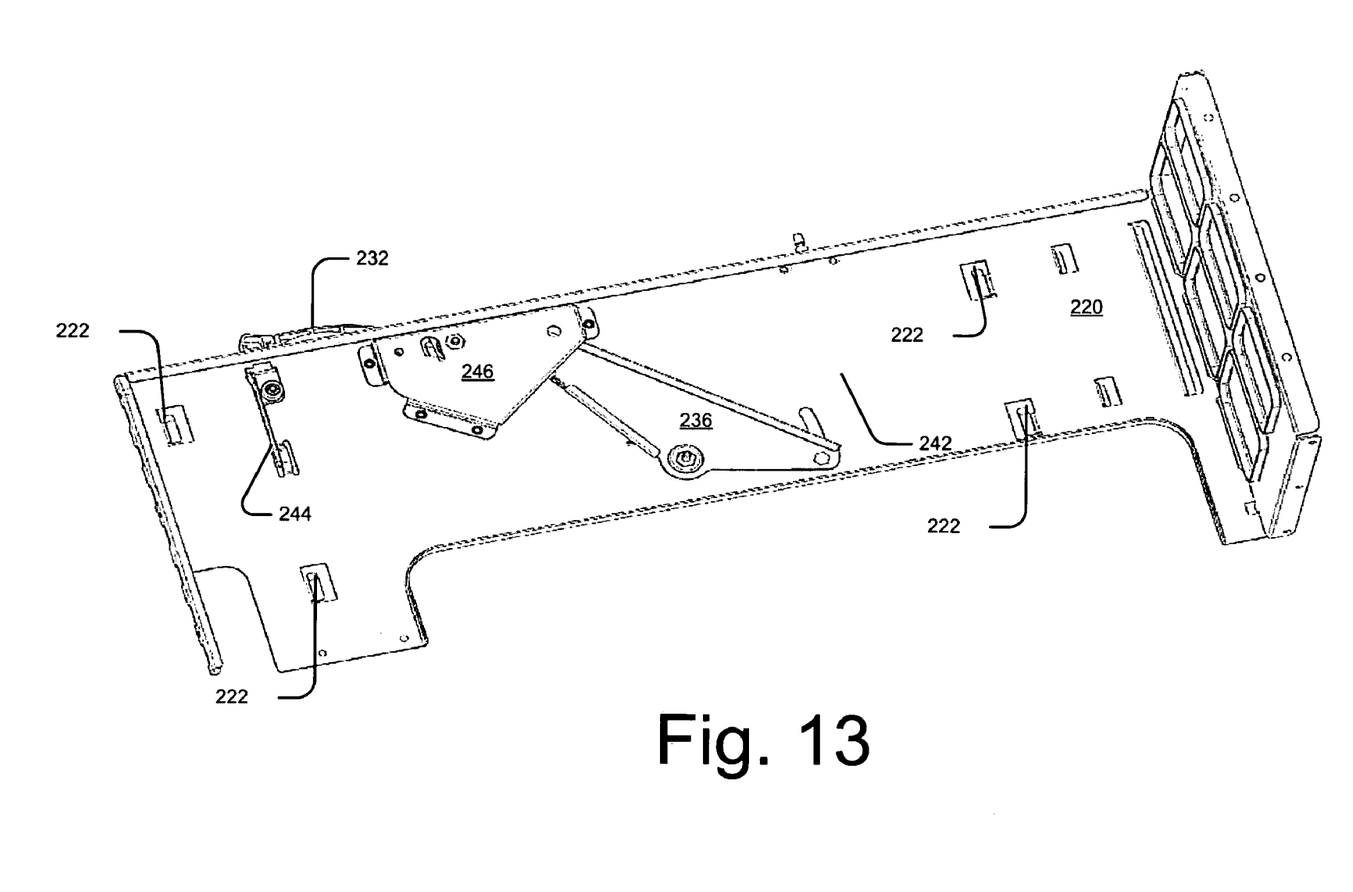
Figure 14:
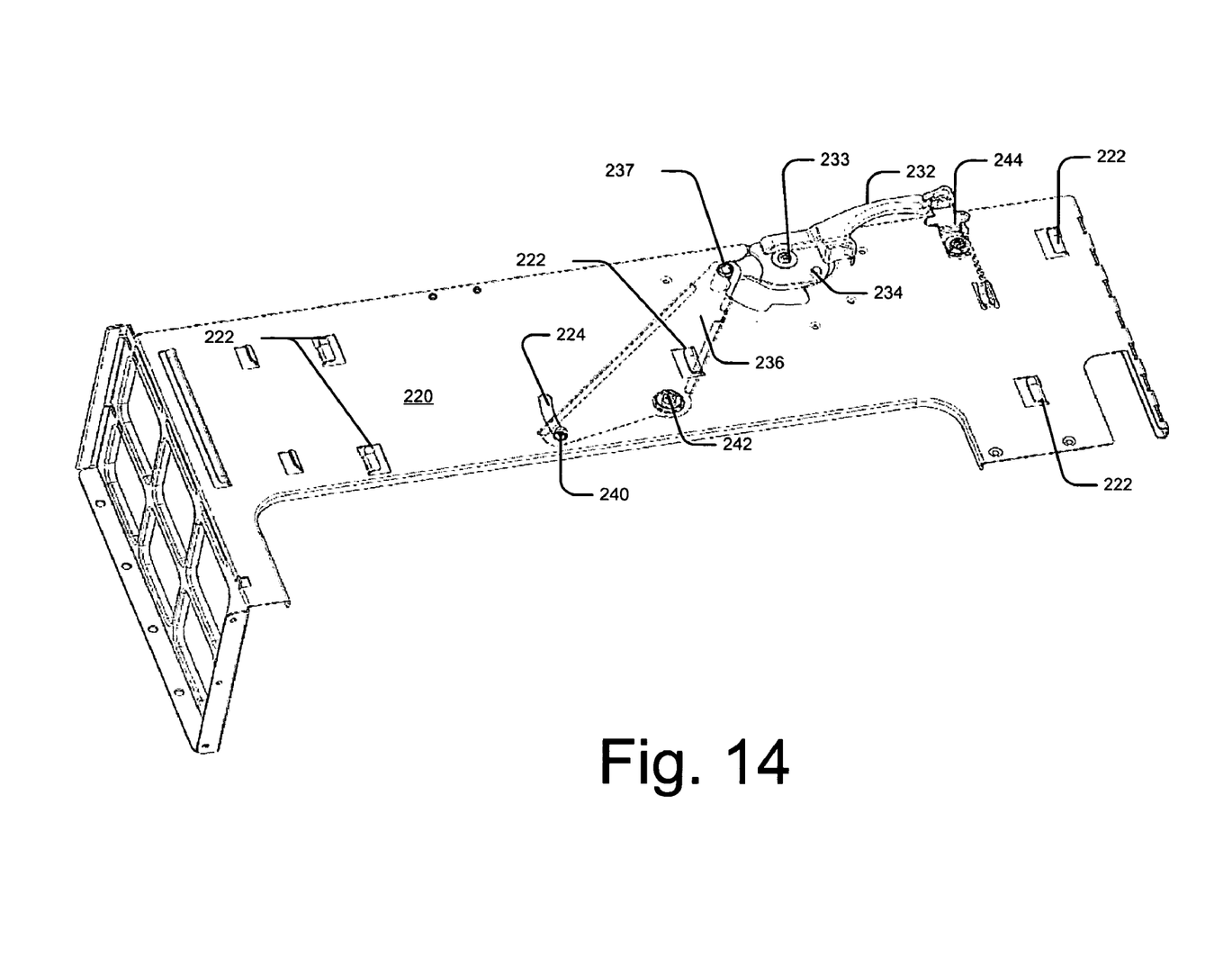

FIG. 13 presents a bottom, perspective view of the floor plate 220 with the engagement assembly 230 assembled and connected to the floor plate 220. FIG. 14 presents a top, perspective view of the floor plate 220 with the engagement assembly 230 assembled and connected to the floor plate 220. In the embodiment depicted in FIGS. 13 and 14, the mechanical force lever 232 is in a "closed" position, such that the mechanical force lever is engaged with ejector button 244.

Referring to FIGS. 13 and 14, the mechanical force lever 232 is connected to the linkage arm 236 by connector 237. Mechanical force lever 232 is rotatably connected to the floor plate 220 by connector 233. In some embodiments, connectors 237 may be implemented as a pin, rivet, bolt, screws, or other suitable connector. Further, ejector button 244 is connected to floor plate 220 by suitable connector.

Referring to FIG. 14, when the engagement assembly 230 is mounted to the floor plate 220, the pin 240 of pin plate 238 extends through a slot 224 in the floor plate 220. Similarly, the pin 234 on mechanical force lever 232 extends above the surface of floor plate 220. When the mechanical force lever 232 is in the closed position as depicted in FIG. 4, the pin 240 is in a first position in slot 224. Similarly, the pin 234 is located in a first position at a first distance from an edge when 222 of floor plate 220.

Figure 15:
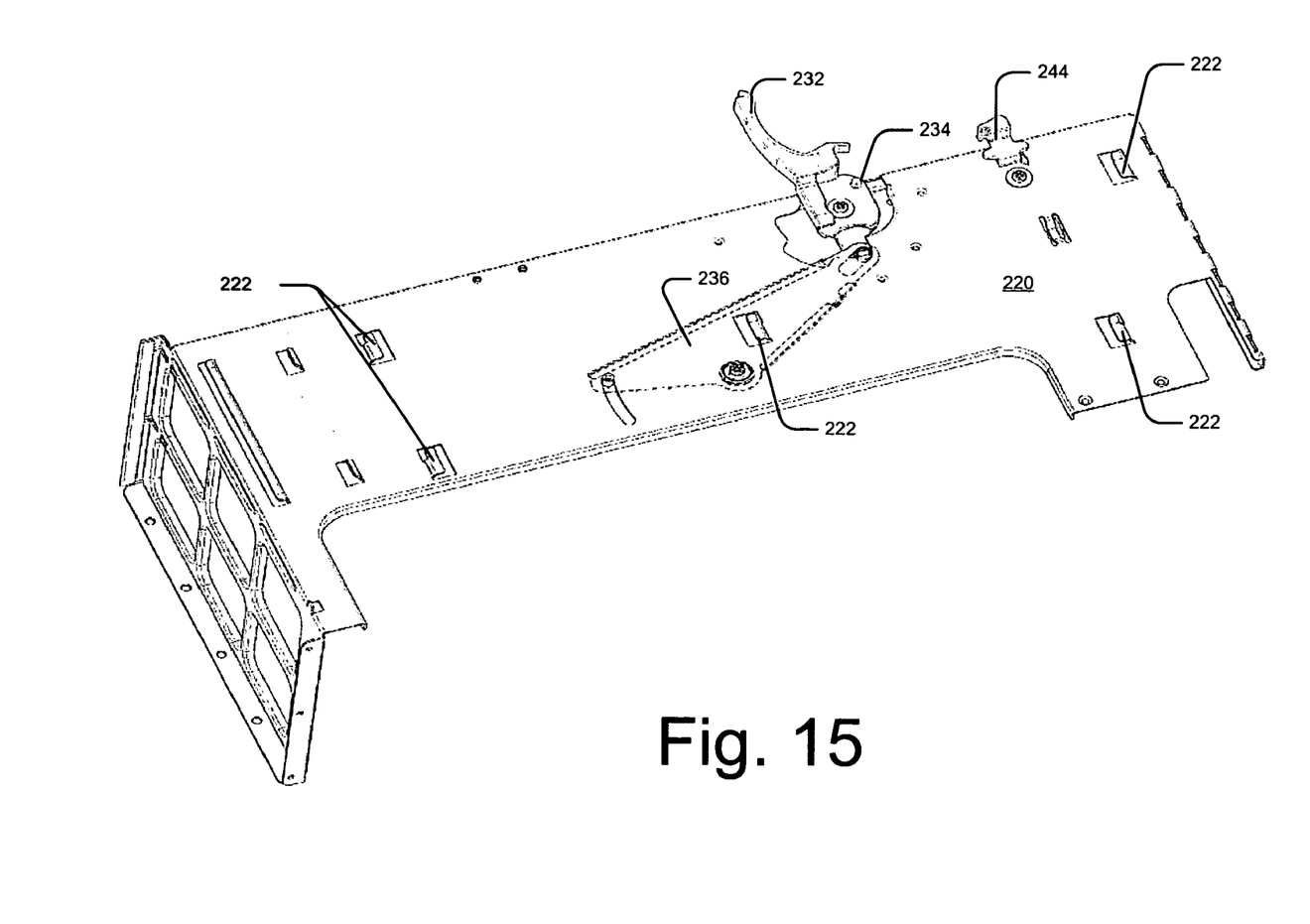

FIG. 15 is a schematic, perspective view of floor plate 220 with the mechanical force lever 232 in a fully open position. Referring to FIG. 15, the mechanical force lever 232 may be disengaged from ejector button 244 manually, e.g., by depressing the ejector button 244 to release mechanical force lever 232. Mechanical force lever 232 may be manually rotated about connector 233 to drive linkage arm 236, which in turn rotates linkage arm 236 about connector 242. Thus, rotating mechanical force lever 232 drives pin 240 in the slot 224. Further, rotating mechanical force lever 232 moves can 234 about the axis of rotation of mechanical force arm 232. Continued rotation of mechanical force lever 232 about connector 233 drives pin 242 a second position in slot 224, and rotates pin 234 to a second position at a second distance from an edge when 221 of floor plate 220.

Thus, the engagement assembly 230 may be used to engage a circuit board assembly with a backplane substantially as described with reference to FIGS. 7-10, above, except that the linkage arm 236 moves the circuit board directly, rather than via a pin plate.

Reference in the specification to "one embodiment" or "an embodiment" means that a particular feature, structure, or characteristic described in connection with the embodiment is included in at least an implementation. The appearances of the phrase "in one embodiment" in various places in the specification are not necessarily all referring to the same embodiment.

What is claimed is:

1. A computer system, comprising:
   a housing;
   a backplane coupled to the housing; and
   at least one floor plate comprising an engagement assembly to connect a printed circuit board assembly to the backplane, wherein the engagement assembly utilizes a single mechanical force lever to secure the printed circuit board assembly to the backplane, wherein:
      the mechanical force lever is connected to the floor plate and rotatable between a first position and a second position;
      the engagement assembly comprises:
         a linkage arm connected to the mechanical force lever;
         a pin plate connected to the linkage arm and to the floor plate, and rotatable between a first position and a second position:
      the floor plate comprises a first slot;
      the pin plate comprises a first pin that extends through the first slot in the floor;
   a printed circuit board assembly; wherein:
   the mechanical force lever comprises a second pin;
   the printed circuit board assembly comprises a second aperture through which the second pin extends when the printed circuit board assembly is mounted onto the floor plate; and
   wherein rotating the mechanical force lever between the first position and the second position drives the first pin between a first position in the first slot and a second position in the first slot, thereby driving the printed circuit board assembly between a first position on the floor and a second position on the floor plate.

2. The computer system of claim 1, wherein the printed circuit board assembly comprises a first aperture through which the first pin extends when the printed circuit board assembly is mounted onto the floor plate.

3. The computer system of claim 1, wherein:
   the floor plate comprises a plurality of hooks; and the printed circuit board assembly comprises a plurality of slots adapted to mate with the plurality of hooks in the floor plate.

4. The computer system of claim 2, wherein rotating the mechanical force lever between the first position and the second position drives the first pin between a first position in the first slot and a second position in the first slot, thereby driving the printed circuit board assembly between a first position on the floor and a second position on the floor.

5. The computer system of claim 1, wherein the printed circuit board assembly comprises: a sensor to generate a signal when the mechanical force lever is removed from the second position; and logic to cut power from the circuit board in response to the signal.

6. The computer system of claim 5, wherein:
the sensor comprises an optical transmitter and receiver; and
the mechanical force lever comprises a tooth to disrupt the sensor.

7. A floor plate for a computer system, comprising:
a plurality of hooks positioned to mate with apertures on a printed circuit board assembly; and
an engagement assembly, comprising:
  a mechanical force lever connected to the floor plate and rotatable between a first position and a second position;
  a linkage arm connected to the mechanical force lever; and
  a pin plate connected to the linkage arm and to the floor plate, and driven by the mechanical force lever between a first position and a second position, wherein the floor plate comprises a first slot, and the pin plate comprises a first pin that extends through the first slot in the floor plate;
a printed circuit board mounted to the floor plate, wherein the printed circuit board assembly comprises a first aperture through which the first pin extends when the printed circuit board assembly is mounted onto the floor plate, wherein rotating the mechanical force lever between the first position and the second position drives the first pin between a first position in the first slot and a second position in the first slot, thereby driving the printed circuit board assembly between a first position on the floor plate and a second position on the floor plate, and wherein:
the mechanical force lever comprises a second pin;
the printed circuit board assembly comprises a second aperture through which the second pin extends when the printed circuit board assembly is mounted onto the floor plate; and
wherein rotating the mechanical force lever between the first position and the second position drives the second pin between a first position and a second position, thereby driving the printed circuit board assembly between a first position on the floor and a second position on the floor plate.

8. The floor plate of claim 7, wherein the printed circuit board assembly comprises: a sensor to generate a signal when the mechanical force lever is removed from the second position; and logic to cut power from the circuit board in response to the signal.

9. The floor plate of claim 8, wherein:
the sensor comprises an optical transmitter and receiver; and
the mechanical force lever comprises a tooth to disrupt the sensor.

* * * * *